(12) United States Patent
Perkins et al.

(10) Patent No.: US 8,901,606 B2
(45) Date of Patent: Dec. 2, 2014

(54) PSEUDOMORPHIC HIGH ELECTRON MOBILITY TRANSISTOR (PHEMT) COMPRISING LOW TEMPERATURE BUFFER LAYER

(75) Inventors: Nate Perkins, Fort Collins, CO (US); Jonathan Abrokwah, Fort Collins, CO (US); Hans G. Rohdin, Los Altos, CA (US); Phil Marsh, Fort Collins, CO (US); John Stanback, Fort Collins, CO (US)

(73) Assignee: Avago Technologies General IP (Singapore) Pte. Ltd., Singagpore (SG)

( * ) Notice: Subject to any disclaimer, the term of this patent is extended or adjusted under 35 U.S.C. 154(b) by 0 days.

(21) Appl. No.: 13/459,864

(22) Filed: Apr. 30, 2012

(65) Prior Publication Data

US 2013/0285119 A1  Oct. 31, 2013

(51) Int. Cl.
*H01L 29/24* (2006.01)
(52) U.S. Cl.
USPC ............ 257/192; 257/194; 257/E29.246; 257/E21.403
(58) Field of Classification Search
USPC ............ 257/E21.403, E21.407, E23.169, 257/E23.179, E29.246, E29.25, E29.252, 257/194, 728
See application file for complete search history.

(56) References Cited

U.S. PATENT DOCUMENTS

| | | | |
|---|---|---|---|
| 6,087,207 A | 7/2000 | Tong | |
| 6,483,134 B1 * | 11/2002 | Weatherford et al. | 257/280 |
| 7,144,765 B2 * | 12/2006 | Anda et al. | 438/167 |
| 7,235,455 B2 | 8/2007 | Green et al. | |
| 7,541,232 B2 | 6/2009 | Robinson et al. | |
| 7,842,972 B2 | 11/2010 | Nichols et al. | |
| 7,851,909 B2 | 12/2010 | Mishra et al. | |
| 7,898,047 B2 | 3/2011 | Sheppard | |
| 8,174,050 B2 | 5/2012 | Boles et al. | |
| 2003/0006426 A1 | 1/2003 | Kodo | |
| 2005/0104087 A1 | 5/2005 | Lan et al. | |
| 2006/0145190 A1 * | 7/2006 | Salzman et al. | 257/192 |
| 2006/0163594 A1 | 7/2006 | Kuzmik | |
| 2008/0026545 A1 * | 1/2008 | Cooke et al. | 438/478 |
| 2008/0237605 A1 | 10/2008 | Murata et al. | |
| 2008/0283870 A1 | 11/2008 | Sato | |
| 2008/0308909 A1 | 12/2008 | Sakai et al. | |
| 2009/0072252 A1 | 3/2009 | Son et al. | |
| 2010/0200877 A1 | 8/2010 | Lee | |
| 2013/0005118 A1 | 1/2013 | Jun et al. | |

OTHER PUBLICATIONS

Luysberg, et al. "Control of stoichiometry dependent defects in low temperature GaAs," L IEEE Semiconducting and Semi-Insulating Materials Conference, 1996, pp. 21-26.
Sawada, Ken , "Elimination of Kink Phenomena and Drain Current Hysteresis in InP-Based HEMTs With a Direct Ohmic Structure", *IEEE Transactions on Electron Devices*, vol. 50, No. 2 Feb. 2003, 310-314.

* cited by examiner

*Primary Examiner* — Zandra Smith
*Assistant Examiner* — Paul Patton

(57) ABSTRACT

A pseudomorphic high electron mobility transistor (pHEMT) comprises: a substrate comprising a Group III-V semiconductor material; buffer layer disposed over the substrate; and a channel layer disposed over the buffer layer. The buffer layer comprises microprecipitates of a Group V semiconductor element. A method of fabricating a pHEMT is also described.

23 Claims, 7 Drawing Sheets ically used in wireless communication systems for switching, power and low noise amplifier applications. A pHEMT device is a semiconductor device, and illustratively includes multiple layers of gallium arsenide (GaAs) based compounds. For example, a typical pHEMT power device includes a GaAs substrate, an epitaxial GaAs buffer layer, an AlGaAs/GaAs superlattice layer, an undoped AlGaAs layer, may include a first doped silicon layer disposed over the superlattice, will include a first spacer, an InGaAs channel layer, a second spacer, an upper doped silicon layer which will typically have a different doping concentration from the first doped silicon layer, an undoped AlGaAs layer, an undoped GaAs layer, and a highly doped GaAs cap layer stacked sequentially on a semi-insulating GaAs substrate. The device includes a source electrode and a drain electrode formed in ohmic contact with the highly doped GaAs cap layer; and a Schottky metal gate electrode formed on the undoped AlGaAs layer.

PSEUDOMORPHIC HIGH ELECTRON MOBILITY TRANSISTOR (PHEMT) COMPRISING LOW TEMPERATURE BUFFER LAYER

BACKGROUND

Pseudomorphic high electron mobility transistors (pHEMTs) are extensively used in wireless communication systems for switching, power and low noise amplifier applications. A pHEMT device is a semiconductor device, and illustratively includes multiple layers of gallium arsenide (GaAs) based compounds. For example, a typical pHEMT power device includes a GaAs substrate, an epitaxial GaAs buffer layer, an AlGaAs/GaAs superlattice layer, an undoped AlGaAs layer, may include a first doped silicon layer disposed over the superlattice, will include a first spacer, an InGaAs channel layer, a second spacer, an upper doped silicon layer which will typically have a different doping concentration from the first doped silicon layer, an undoped AlGaAs layer, an undoped GaAs layer, and a highly doped GaAs cap layer stacked sequentially on a semi-insulating GaAs substrate. The device includes a source electrode and a drain electrode formed in ohmic contact with the highly doped GaAs cap layer; and a Schottky metal gate electrode formed on the undoped AlGaAs layer.

Power amplifiers that are constructed in known pHEMT technologies often suffer drain and gate lag, and other non-idealities such as kink effects. These non-idealities are in part due to the presence of deep level traps in the substrate and at the interface of the substrate and buffer layer. These traps may change charge state during some modes of device operation. These states have a comparatively long lifetime and introduce slow device current transients which can adversely impact the application under some conditions. For example, non-ideal kink characteristics contribute to difficulties constructing some amplifier bias circuits. More significantly, as a result of the relatively slow drain lag, the power amplifier cannot adequately track rapid changes in the applied drain voltage ($V_d$) on the final stage of the amplifier. This adversely impacts the utility of known pHEMT devices for some modern amplifier power conservation schemes, for example those obtained by dynamic changes to the amplifier drain voltage. As such, known power amplifiers having known pHEMTs are unacceptable in many applications.

What is needed, therefore, is a pHEMT that overcomes at least the referenced deficiencies.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1:
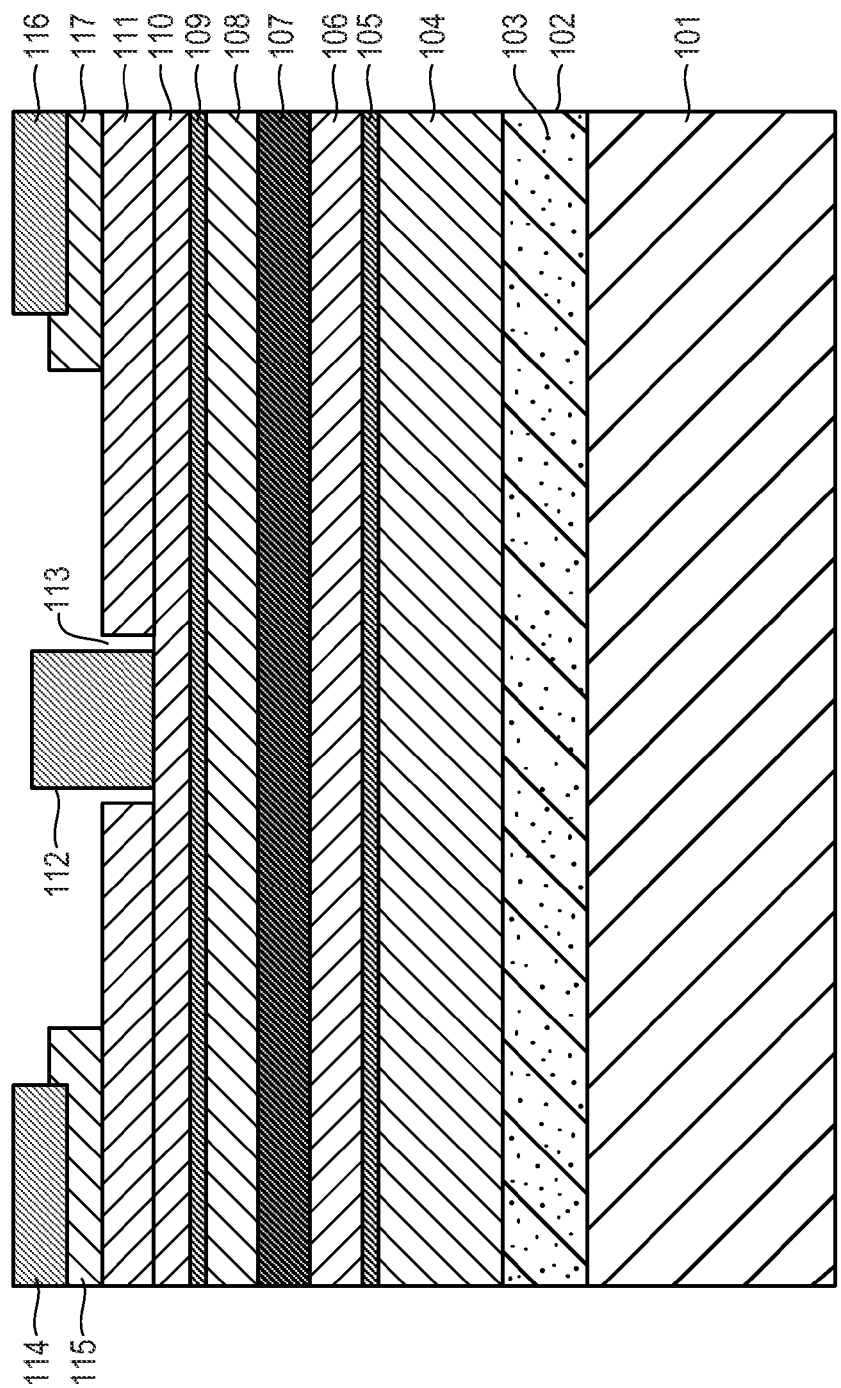
FIG. 1 shows a cross-sectional view pHEMT in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" may be used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to a pHEMT device and its method of fabrication. The pHEMT device comprises a buffer layer disposed over the substrate. This buffer layer is often referred to below as the low temperature (LT) buffer layer because it is grown at a comparatively low temperature. The substrate comprises deep level defects having comparatively long lifetimes, whereas the LT buffer layer comprises a comparatively high concentration of traps having comparatively short lifetimes. Moreover, the LT buffer layer comprises microprecipitates of a Group V element (e.g., As) that serve to shield the carriers in the channel from the influence of the deep level traps in the substrate.

The method of fabrication comprises growing the LT buffer layer at a comparatively low temperature, which results in a comparatively high concentration of substitutional defects and interstitial defects comprising the Group V element and Group III vacancies. The method further comprises first annealing the LT buffer layer at a relatively low temperature, which reduces lattice mismatch with the substrate, and subsequently grown layers, and also leads to a high concentration of traps having a comparatively short lifetime (i.e., "fast traps") in the LT buffer layer. Prior to growing the active layers, intervening layer or layers between the LT buffer and active layers of the pHEMT are grown at higher temperature between approximately 450° C. and approximately 590° C., which improves resistivity of the buffer layers.

Notably, the pHEMT devices of the representative embodiments are described comprising certain materials, stoichiometries and methods of fabrication. These materials, stoichiometries and methods of fabrication are merely illustrative, and it is emphasized that other materials, stoichiometries and methods of fabrication that are within the purview of one of ordinary skill in the art having the benefit of the present disclosure are contemplated.

FIG. 1 depicts a pHEMT 100 in accordance with a representative embodiment. The pHEMT 100 comprises a substrate 101 comprised of a compound semiconductor. For example, the compound semiconductor may be a Group III-V semiconductor. Illustratively, the substrate 101 comprises a layer of semi-insulating GaAs. The substrate 101 may comprise a binary semiconductor, a ternary semiconductor, a quaternary semiconductor or a quinary Group III-V semiconductor material. Notably, the representative embodiments are described in the context of Group III-V semiconductor materials. It is emphasized that this is illustrative, and the use of Group II-VI semiconductor materials is also contemplated for use as the substrate 101, and subsequent materials of the pHEMT 100.

Figure 3:
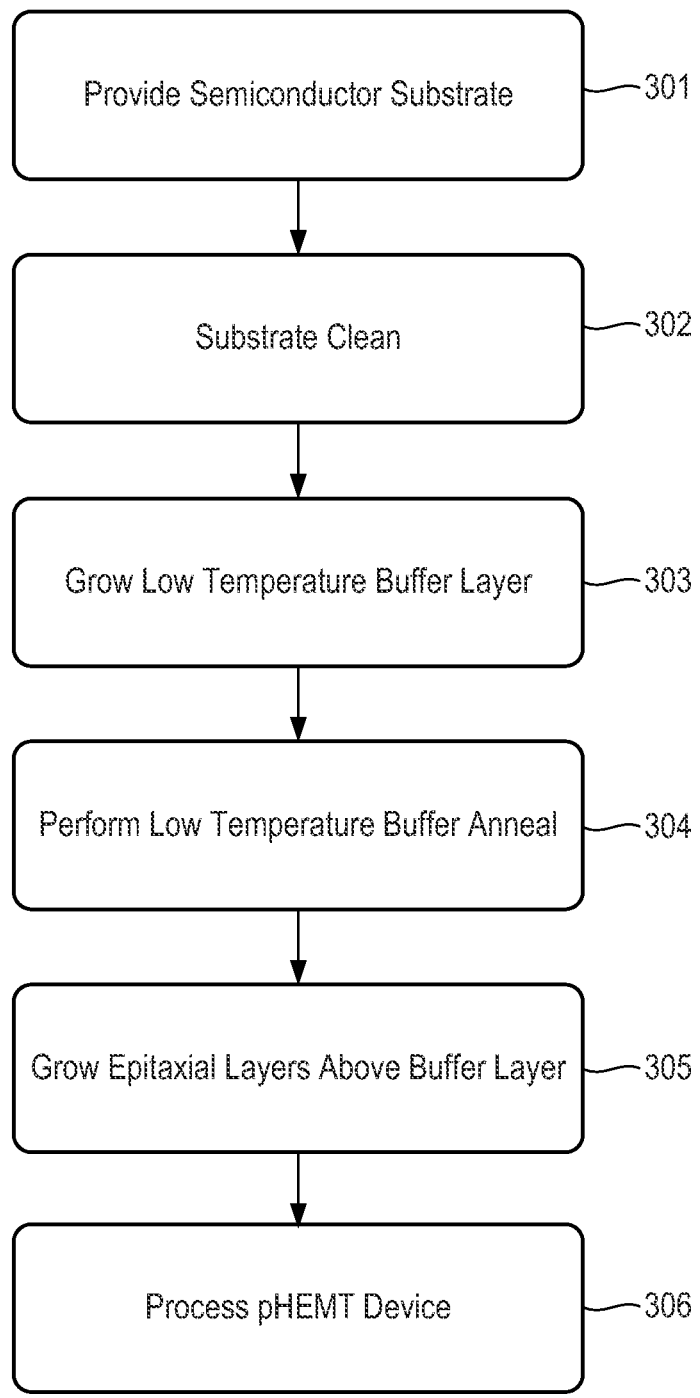
FIG. 3 is a flow chart depicting a method of fabricating a pHEMT device in accordance with a representative embodiment.

A LT buffer layer 102 is disposed over the substrate 101, and is fabricated in accordance with methods of representative embodiments described more fully below. In accordance with a representative embodiment, the LT buffer layer 102 has a thickness in the range of approximately 0.25 μm to approximately 0.5 μm. The LT buffer layer 102, which after annealing described below, comprises a plurality of microprecipitates 103, which are depicted in FIG. 3 exaggerated in size and few in number. These microprecipitates 103 comprise the Group V element of the Group III-V semiconductor and are formed during an anneal sequence performed after the low temperature growth of the LT buffer layer 102. The microprecipitates 103 are believed to form Schottky domains within the LT buffer layer 102 that deplete the semiconductor of carriers in regions around the microprecipitates 103. As a result, the Schottky domains provide electrostatic shielding and carrier scattering to reduce if not eliminate the transport of carriers to deep level traps of the substrate 101. Beneficially, in accordance with the representative embodiments of the present teachings, the Schottky domains reduce if not substantially eliminate the transient charge due to deep level ("slow") traps in the substrate 101. Otherwise, these deep level traps in the substrate 101 would have a deleterious impact the electrical performance of the pHEMT 100, primarily due trap charge states opposite the channel (see channel layer 107 in FIG. 1) from the gate (known as "backgating").

The LT buffer layer 102 also comprises a comparatively high concentration of substitutional Group V on Group III site semiconductor point defects (e.g., As on Ga site point defects, or As antisite defects) and interstitial Group V semiconductor (e.g., As) defects and some Group III (e.g., Ga) vacancy pairs as a result of the method of growing the LT buffer according to the present teachings. These defects result in a comparatively high concentration of comparatively "fast" traps, which have comparatively short non-radiative lifetimes. In accordance with a representative embodiment, substitutional Group V on Group III site semiconductor point defects (e.g., As on Ga site point defects, or As antisite defects) and interstitial Group V semiconductor (e.g., As) combined have a concentration between approximately $1 \times 10^{18}$ cm$^{-3}$ to approximately $5 \times 10^{20}$ cm$^{-3}$. Illustratively, these "fast" traps have carrier lifetimes typically less than approximately 1 ps ($1 \times 10^{-12}$ s). In accordance with a representative embodiment, the "fast" traps in the LT buffer layer 102 have a non-radiative lifetime in the range of approximately 1fs ($1 \times 10^{-15}$ s) to approximately 1 ps.

As described more fully below, the presence of fast traps in the LT buffer layer 102 results in a reduction in the drain lag when the bias states of the pHEMT 100 are changed. enabling an amplifier (not shown) comprising the pHEMT 100 to operate with improved performance, particularly when the drain bias is dynamically modulated to keep the amplifier operating closer to compression as is desired in power applications especially. As a result, the pHEMT 100 of the representative embodiment can operate at a comparatively high efficiency.

The remaining components of the pHEMT 100 (i.e., disposed above the LT buffer layer 102) are known materials fabricated using known methods. Illustrative materials are presented, but are not intended to be limiting.

The pHEMT 100 comprises an epitaxial buffer layer 104 disposed over the LT buffer layer 102. The epitaxial buffer layer 104 is either a monolithic material or a superlattice structure, comprising for example, AlGaAs/GaAs layers in sequence. The epitaxial buffer Layer 104 is typically undoped, and typically comprises either GaAs or a short period superlattice of GaAs/AlGaAs. Illustratively, epitaxial buffer layer 104 is a short period superlattice and comprises GaAs layers having a thickness on the order of approximately 15 Å to approximately 50 Å, and alternating with layers of AlGaAs having a thickness of approximately 50 Å to approximately 200 Å. The total thickness of the epitaxial buffer layer 104 is between approximately 500 Å to approximately 3500 Å.

A first charge supply layer 105 is disposed over the epitaxial buffer layer 104 illustratively comprises AlGaAs. The first charge supply layer 105 may be a thin bulk-doped layer, such as GaAs or AlGaAs doped with Si to a doping concentration of approximately of $1 \times 10^{18}$ cm$^{-3}$), or may be a delta-doped layer (typically Si-doped), which works in conjunction with a second charge supply layer 109 to produce a total electron sheet concentration in a pseudomorphic channel layer ("channel layer") 107 between approximately $1 \times 10^{12}$ cm$^{-2}$ and $3 \times 10^{12}$ cm$^{-2}$. First charge supply layer 105 typically has a thickness of between 0 Å and approximately 100 Å.

A first spacer layer 106 is disposed over the first charge supply layer 105. The first spacer layer 106 separates ionized donor states from the channel layer 107, effectively eliminating mobility degradation due to impurity scattering. The channel layer 107 is disposed over the first spacer layer 106 and illustratively comprises InGaAs. Typically, channel layer 107 consists of undoped $In_xGa_{1-x}As$ (x ranges from 15% to 35%) and has a thickness between approximately 50 Å 50-150 Å.

Notably, in accordance with a representative embodiment, the total thickness of epitaxial buffer layer 104, the first charge supply layer 105 and the first spacer layer 106 (i.e., the layers between the LT buffer layer 102 and the channel layer 107) is beneficially in the range of approximately 500 Å to approximately 3500 Å. Beneficially, by providing a comparatively "thin" stack of layers between the LT buffer layer 102 and the channel layer 107, a reduction in leakage current is realized. Moreover, providing a comparatively thin stack of layers between the LT buffer layer 102 and the channel layer 107 reduces the drain lag, thereby providing an improved response time.

A second spacer layer 108 is provided over the channel layer 107, and one or more second charge supply layers 109 are provided over the second spacer layer 108. Second spacer layer 108 may consist of undoped GaAs or AlGaAs, with a thickness between approximately 25 Å and approximately 100 Å. A Schottky contact layer 110 is provided over the second charge supply layer 109. Schottky contact layer 110 typically comprises undoped AlGaAs, and typically has a thickness of between approximately 50 Å and approximately 400 Å. Over the Schottky contact layer 110, layer 111 is added to facilitate a high breakdown recess for the device. This layer 111 is typically undoped GaAs or AlGaAs, but may also comprise a thinner heavily doped layer as a portion of its construction. The total thickness of layer 111 ranges from approximately 100 Å and approximately 700 Å. A Schottky gate 112 is provided in a typically etched or sintered recess 113 and is in contact with the Schottky contact layer 110. A source contact 114 is provided over a heavily doped first ohmic contact layer 115, and a drain contact 116 is provided over is provided over a suitable second ohmic contact layer 117. The heavily doped first ohmic contact layer 115 is typically GaAs, is usually doped in the range $1\times10^{18}$ cm$^{-3}$ and $2\times10^{19}$ cm$^{-3}$, and has thickness of approximately 200 Å and approximately 2000 Å. Source contact 114 and drain contact 116 may consist of any ohmic suitable contact metal stack, but are generally an alloy of AuGeNi with thickness from several hundred to several thousand Angstroms.

Figure 2A:
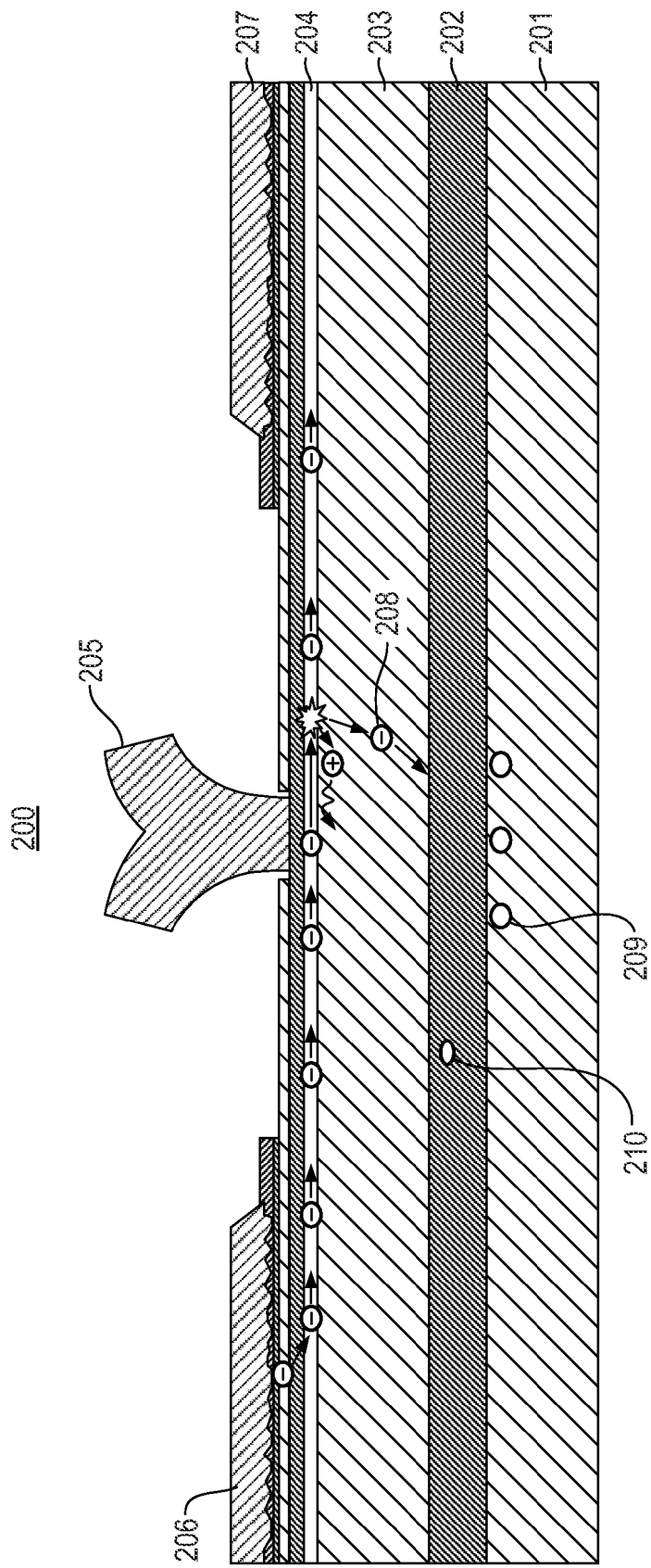
FIG. 2A depicts a pHEMT device (in cross-section) of a representative embodiment operating at comparatively high drain bias ($V_{ds}$).

FIG. 2A depicts a pHEMT 200 (in cross-section) in accordance with a representative embodiment and operating at comparatively high drain bias ($V_{ds}$). Certain of the details of the pHEMT 200 are common to pHEMT 100 described above, and are not repeated to avoid obscuring the presently described embodiment. Moreover, pHEMT 200 may be fabricated in accordance with the methods of the representative embodiments described below.

The pHEMT 200 comprises a substrate 201, and an LT buffer layer 202 disposed thereover. The LT buffer layer 202 comprises a comparatively high concentration of traps having a comparatively short lifetime. Moreover, the LT buffer layer 202 comprises microprecipates of a Group V element (e.g., As). Additional layers 203 are provided between the LT buffer layer 202 and a pseudomorphic channel ("channel") 204. These layers 203 include, for example, epitaxial buffer layer 104, a first charge supply layer 105 and a first spacer layer 106.

A gate 205, a source 206 and a drain 207 are disposed over the channel 204, and include for example second spacer layer 108, second charge supply layer 109, Schottky contact layer 110, first ohmic contact layer 115, and second ohmic contact layer 117.

During high bias conditions depicted in FIG. 2A, the LT buffer layer 202 effectively shields deep level traps 209 from mobile charge 208 that comes from the pHEMT 200 operating under high drain bias. This mobile charge 208 may be generated by impact ionization events, may comprise hot electrons, or may simply be incompletely confined carriers from the active region of the pHEMT that drift or diffuse to the substrate 101. In known pHEMT devices which do not include the LT buffer layer 202 of the present teachings, mobile charge 208 influences the equilibrium of deep level traps 209 in the substrate 201, resulting in net negative charge in deep level traps 209 which result in backgating of the pHEMT. Beneficially, in accordance with the present teachings, LT buffer layer 202 shields deep level traps 209 in the substrate 101 from mobile charge 208, which causes the charge on deep level traps 209 to remain static regardless of the bias condition of the pHEMT. Moreover, the LT buffer layer 202 comprises a comparatively high concentration of comparatively "fast" traps 210. By contrast to the deep level traps of the substrate 101, the re-equilibration of carriers being recombined with traps and carriers in traps that are discharged back to the channel 204 in LT buffer layer 202 is comparatively fast. As such, the LT buffer layer 202 effectively prevents mobile charge 208 from being transported through the LT buffer layer 202. Beneficially, by virtue of the comparatively high density of comparatively "fast" traps 210 in LT buffer layer 202 and the depletion regions formed by the microprecipitates (e.g., As) in LT buffer layer 202, the deleterious influence of the deep level traps 209 in the substrate 201 is substantially mitigated if not eliminated.

Figure 2B:
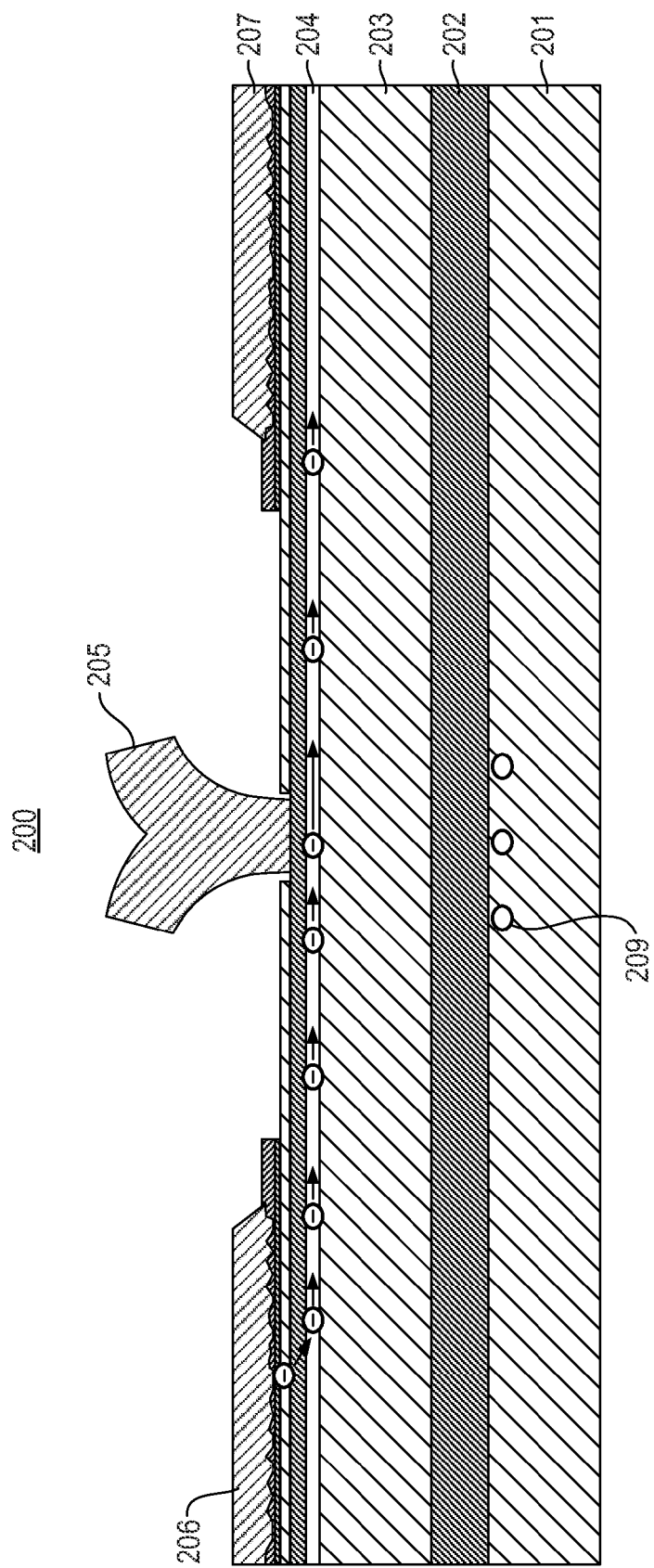
FIG. 2B depicts a pHEMT device (in cross-section) of a representative embodiment operating at comparatively low drain bias ($V_{ds}$).

FIG. 2B depicts pHEMT 200 (in cross-section) operating at comparatively low drain bias ($V_{ds}$). While the influence of the deep level traps 209 is lower during low bias conditions, the LT buffer layer 202 continues to shield carriers in the channel 204, and reduces the rate of recombination of carriers with the deep level traps.

As is known, at each bias operation low and high, an equilibrium is reached between the mobile carriers and the capture and discharge of mobile carriers from fixed traps. Because of the comparatively long lifetime of deep level traps 209, reaching this equilibrium in a known pHEMT takes a comparatively long time. Moreover, each time the device bias is changed, a new equilibrium is reached between carriers being recombined with traps and carriers in traps that are discharged back to the channel. So, each time a known pHEMT switches between high bias operation and low bias operation, these equilibriums need to be reached. This "re-equilibration" is dependent on the lifetime of the deep level traps found in the substrate 201. Stated somewhat differently, the population of acceptor traps and donor traps that are ionized changes depending upon whether the device is operating in a high bias (high electrostatic field) or a low bias (low electrostatic field). This change in the population of the traps is dependent on the non-radiative lifetime of the deep level traps. Because of the comparatively long non-radiative lifetime of deep-level traps in the substrate in known pHEMTs, this change in population takes a comparatively long time, and ultimately impacts the drain lag of the known pHEMT, resulting in undesirable settling times for the device.

By contrast, through the combination of a comparatively high concentration of "fast" traps and the electrostatic shielding effect provided by the microprecipitates of the LT buffer layer 202 of pHEMT 200, the re-equilibration of carriers being recombined with traps and carriers in traps that are discharged back to the channel 204 in LT buffer layer 202 is comparatively fast, and the change to trap ionization in "slow" deep-level traps in the substrate 201 is significantly reduced, if not eliminated. As described more fully below, pHEMT 200 realizes a significant improvement in drain lag and linear response.

FIG. 3 is a flow chart depicting a method 300 of fabricating a pHEMT device in accordance with a representative embodiment. The method may be used to fabricate pHEMTs 100, 200 of the representative embodiments described above.

At 301, the method comprises providing a Group III-V semiconductor substrate, typically GaAs. At 302, the substrate undergoes a cleaning sequence using known methods and materials. Such cleaning methods may include a known combination of solvent and/or etching cleans. The known cleaning method invariably includes an in-situ deoxidation at a comparatively high temperature in the epitaxial reactor, usually under Group V (e.g., As) flux, and the known method is applicable to step 302.

At 303, an LT buffer layer is grown over the substrate using an epitaxial growth method such as molecular beam epitaxy (MBE). The LT buffer layer is grown at a temperature in the range of less than approximately 250° C. to approximately 325° C. and with an excess flux of Group V (e.g., As) atoms to promote formation of a comparatively high concentration of interstitial and substitutional (antisite) defects in the LT buffer layer. As should be appreciated by one of ordinary skill in the art, the Group V-to Group III flux ratio depends on growth temperature, reactor geometry and growth rate. In accordance with a representative embodiment, in the growth sequence of 303 of method 300, the Group V (e.g., As) to Group III material flux ratio is selected so that the resulting excess Group V material in the LT buffer layer grown in 303 results in a strain of approximately 400 ppm in the LT grown buffer layer. More generally, the Group V material to Group III flux ratio is selected such that the resulting excess Group V material in the grown LT buffer layer grown in 303 results in a strain in the grown LT buffer layer in the range of approximately 300 ppm to approximately 500 ppm. The measurement of the strain (for example, by double crystal x-ray diffraction) and proper selection of the Group V to Group III material flux ratio to obtain the target strain are beneficial to achieving the proper amount of excess Group V material (e.g., As), which is required to achieve desired characteristics of the LT buffer layer of the present teachings.

At 304, a post growth anneal step is carried out. The anneal step serves involves heating the LT buffer layer, which serves to promote a closer match of the lattice constant of the LT buffer layer with the underlying substrate, and with subsequently grown layers. During the anneal step, nearly all of the excess strain is relieved from the LT buffer layer (i.e., the strain in the LT buffer layer is insignificant), and much of the excess Group V material (e.g., As) segregates to form microprecipitates in the LT buffer layer as described above. The increased temperature of the anneal step promotes a precipitate growth, where comparatively higher temperatures and longer anneal times result in increased microprecipitate size. However, annealing higher temperatures and for longer anneal times, can result in a lower concentrations of point defect Group V (e.g., As) complexes in the LT buffer layer. As such, in a representative embodiment, the anneal step is carried out at a temperature less than approximately 575° C. but greater than approximately 400° C. This anneal occurs in the epitaxial growth chamber, under a sufficient minimum background flux of Group V material (e.g., As) as needed to maintain an epitaxial surface. Notably, it is beneficial to carry out the initial anneal step at as low of a temperature as possible (preferably, for example, between approximately 400° C. and approximately 470° C.) to promote the highest concentration and shortest lifetime of fast traps in the LT buffer layer, while still relieving the excess strain from the LT buffer layer. As such, it is particularly beneficial to effect the anneal step and growth of subsequent layers at temperatures that are less than the noted upper limit (approximately 590° C.) in order to avoid adversely impacting the LT buffer layer characteristics.

At 305, the remaining epitaxial layers of the pHEMT are grown. These layers are grown over the LT buffer layer using known methods and materials. For example, referring to FIG. 1, step 305 comprises the growth of the epitaxial buffer layer 104, the first charge supply layer 105, the first spacer layer 106, the channel layer 107, the second spacer layer 108, the second charge supply layer 109, the Schottky contact layer 110, and (in the same processing sequence) the first and second ohmic contact layers 115 and 117. These layers are doped as necessary at this stage of the method 300. As noted above, the total thickness of the epitaxial buffer layer 104, the first charge supply layer 105 and the first spacer layer 106 (i.e., the layers between the LT buffer layer 102 and the channel layer 107) is beneficially in the range of approximately 500 Å to approximately 3500 Å. Moreover, during the formation of the layers between the LT buffer layer 102 and the channel layer 107, in some implementations it may be useful to remove or not include aluminum in the layers.

Finally, at 306 further processing is effected to complete the method 300. Illustratively, the source, drain and gate are formed using known methods and materials.

Figure 4:
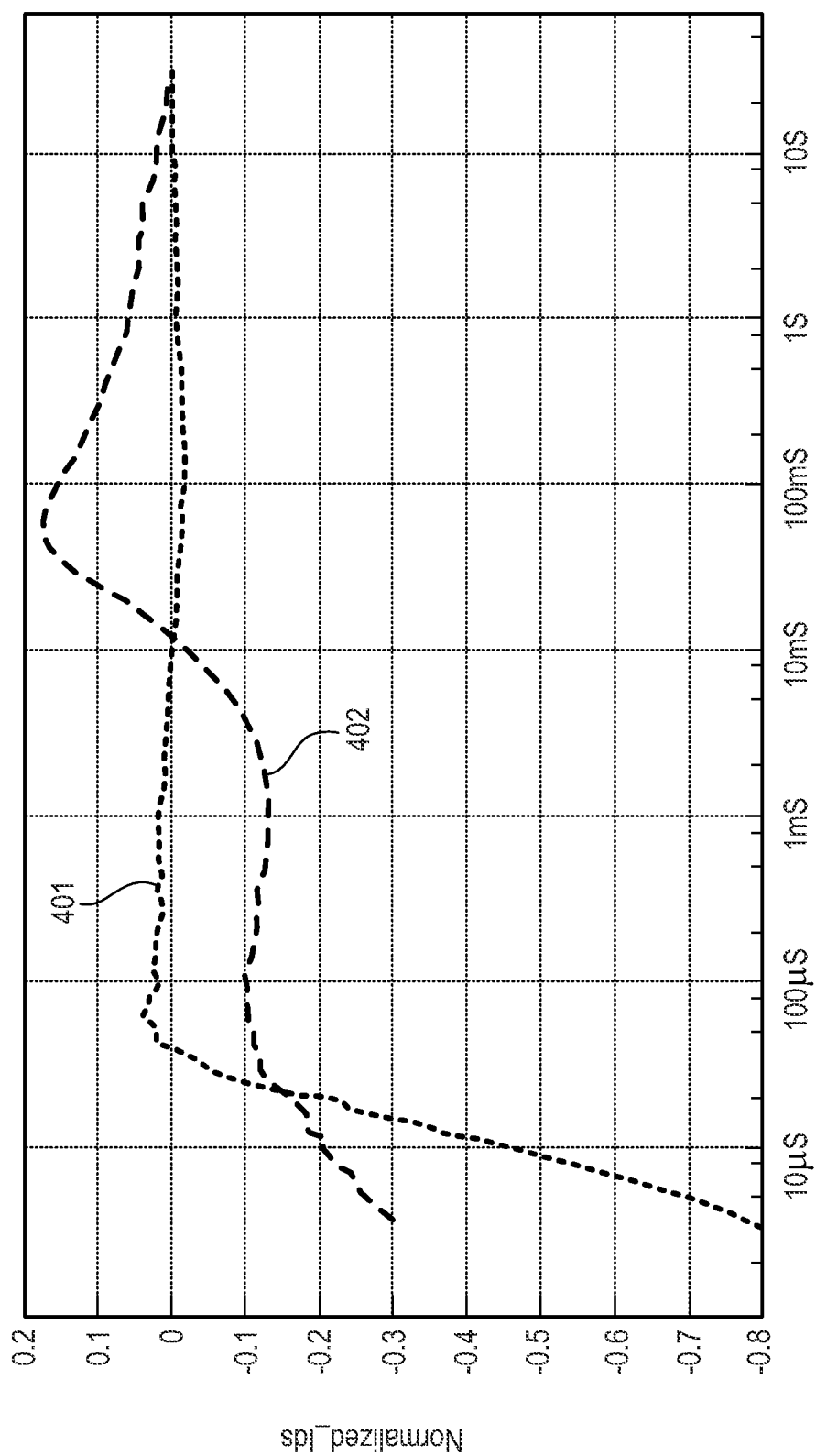
FIG. 4 is a graph comparing the drain lag ($I_{ds}$ versus time after a sudden reduction in the drain voltage ($V_d$) of a known pHEMT and a pHEMT according to a representative embodiment.

FIG. 4 is a graph comparing the drain lag ($I_{ds}$ versus time after a sudden reduction in $V_d$) of a known pHEMT and a pHEMT according to a representative embodiment. Notably, the abscissa of FIG. 4 represents the log scale for time since the pHEMT was transitioned from high bias 5V to low bias 1V. The ordinate is the relative deviation from the final drain current over time; i.e., $(Id_{instantaneous} - Id_{final})/Id_{final}$. Curve 401 depicts the deviation versus time of a pHEMT of a representative embodiment, and curve 402 represents the deviation versus time of a known pHEMT. By way of example, a normalized $I_{ds}$ value of −0.1 indicates that the instantaneous drain current is about 10% lower than what it is when the pHEMT finally settles. As can be appreciated from a review of curve 402, the known pHEMT device does not settle to the final value until several seconds have elapsed, whereas the invention settles around 100 microseconds]

Figure 5A:
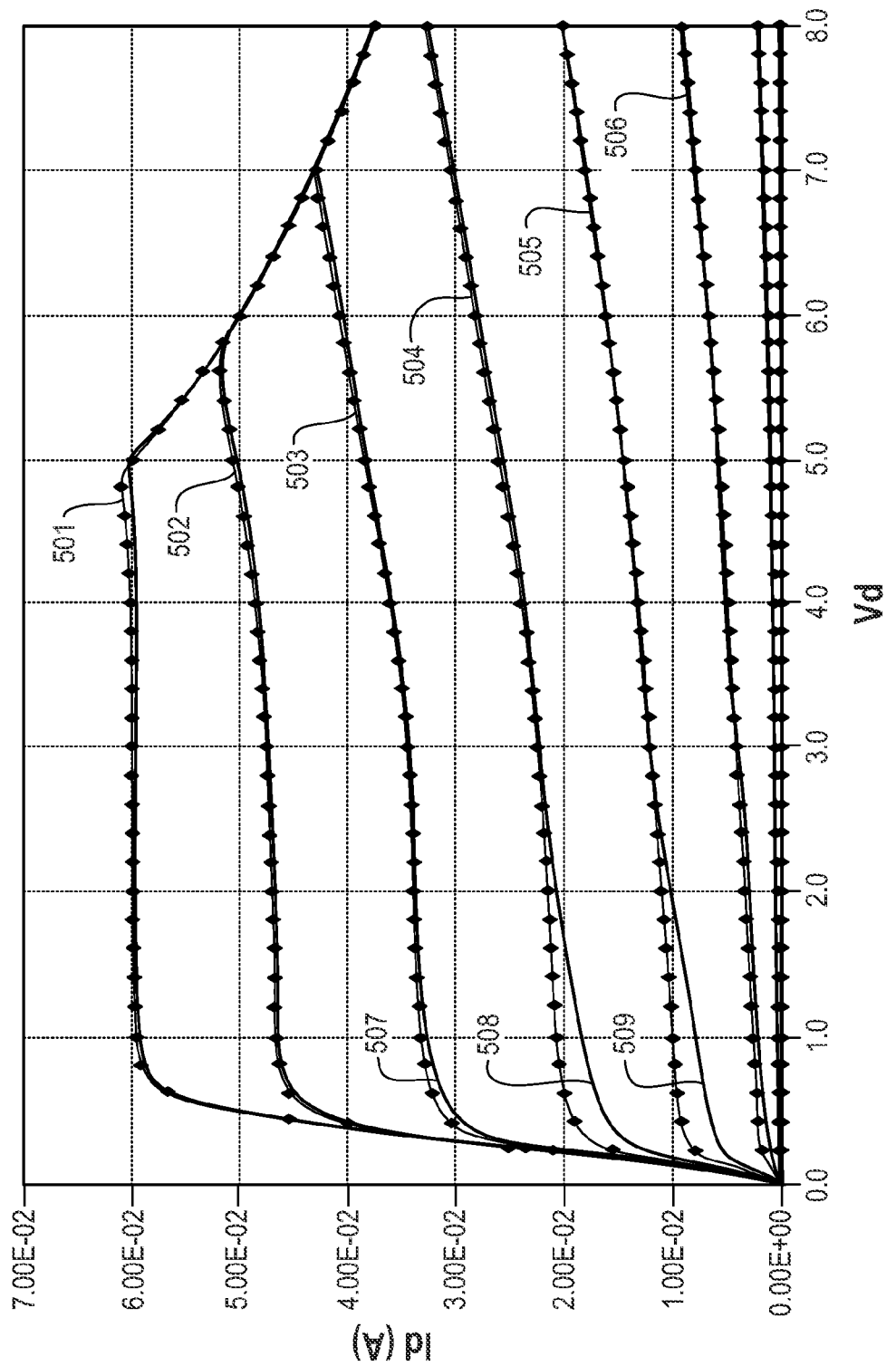
FIG. 5A is a graph showing the drain current ($I_d$) versus drain voltage ($V_d$) versus time for selected gate voltages of a known pHEMT.

FIG. 5A is a graph showing the pulsed drain current ($I_d$) versus drain voltage ($V_d$) versus time for a selected series of gate voltages of a known pHEMT. Notably, curves 501~506 (having diamond markers) depict the settled $I_d$ vs. $V_d$ for descending gate voltage ($V_g$). The applied gate voltage for the ($I_d$ vs. $V_d$) in curve 506 is a comparatively low gate voltage (e.g., 0 V), the gate voltage in curve 501 is a comparatively high gate voltage (e.g., 1.0 V).

Curves 507, 508 and 509 depict $I_d$ vs. $V_d$ illustratively at 1 msec after the bias is supplied in pulsed fashion. As can be appreciated from a review of curves 507~509 at comparatively low to moderate applied drain voltages (the so-called "knee" region of the $I_d$ vs. $V_d$ curves) there is a change over time. This dynamic depression is commonly referred to as a "kink" in the knee region and generally has a deleterious impact on performance of the pHEMT in typical applications such as in a power amplifier. As such, it is beneficial to reduce this time dependent "kink." Plainly, the response of the known pHEMT depicted in FIG. 5A has an undesirable kink in the $I_d(V_d)$ characteristics at low to moderate applied drain voltages.

Figure 5B:
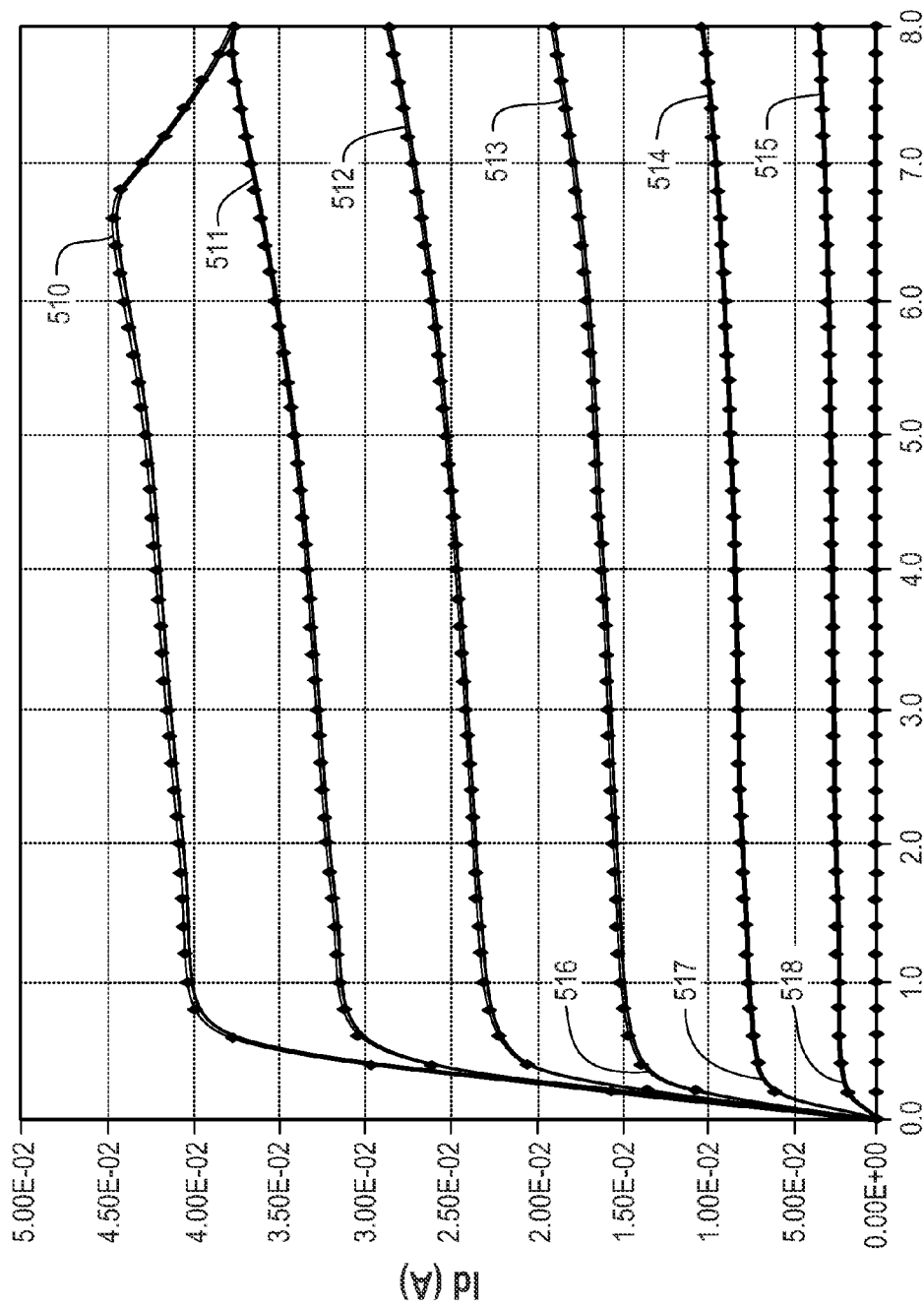
FIG. 5B is a graph showing the drain current ($I_d$) versus drain voltage ($V_d$) versus time for selected gate voltages in accordance with a representative embodiment.

FIG. 5B is a graph showing the pulsed drain current ($I_d$) versus drain voltage ($V_d$) versus time for selected gate voltages of a pHEMT device in accordance with a representative embodiment. Notably, curves 510~515 (having diamond markers) depict $I_d$ vs. $V_d$ for descending gate voltage ($V_g$). The applied gate voltage for the ($I_d$ vs. $V_d$) in curve 515 is a comparatively low gate voltage (e.g., 0 V), the gate voltage in curve 510 is a comparatively high gate voltage (e.g., 1.0 V).

Curves 516, 517 and 518 depict $I_d$ vs. $V_d$ in which the drain current is pulsed, again illustratively at 1 msec. As can be appreciated from a review of curves 516~518 at comparatively low to moderate applied drain voltages there is substantially no difference in the knee region $I_d(V_d)$ resulting from the pulsed drain current. Beneficially, a pHEMT device comprising the LT buffer layer of a representative embodiment has a significantly reduced $I_d(V_d)$ kink, particularly in the important low-current region.

In accordance with representative embodiments, pHEMTs for various applications and their methods of fabrication are disclosed. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A pseudomorphic high electron mobility transistor (pHEMT), comprising:
   a substrate comprising a Group III-V semiconductor material; and
   a buffer layer disposed over the substrate, wherein the buffer layer comprises microprecipitates of a Group V semiconductor element; and
   a pseudomorphic channel layer disposed over the buffer layer.

2. A pHEMT as claimed in claim 1, wherein the buffer layer electrically shields carriers in the pseudomorphic channel layer from deep level traps in the substrate.

3. A pHEMT device as claimed in claim 1, wherein the buffer layer further comprises comparatively fast traps arising from excess Group V atoms in the buffer layer.

4. A pHEMT as claimed in claim 3, wherein the comparatively fast traps have a lifetime in the range of approximately 1 femtosecond (fs) to approximately 1 picosecond (ps).

5. A pHEMT as claimed in claim 1, wherein the Group III-V semiconductor material comprises gallium (Ga) and arsenic (As).

6. A pHEMT as claimed in claim 1, wherein the butter layer further comprises comparatively fast traps arising from excess Group V atoms in the buffer layer and the Group V semiconductor element comprises As.

7. A power amplifier comprising the pHEMT as recited in claim 1.

8. A pHEMT as claimed in claim 1, further comprising a charge supply layer disposed over the buffer layer and beneath the pseudomorphic channel layer.

9. A pHEMT as claimed in claim 8, wherein the charge supply layer is a first charge supply layer, and the pHEMT comprises a second charge supply layer disposed over the pseudomorphic channel layer.

10. A pseudomorphic high electron mobility transistor (pHEMT), comprising:
    a substrate comprising a Group semiconductor material; and
    a buffer layer disposed over the substrate, the buffer layer comprising: microprecipitates of a Group V semiconductor element; interstitial defects comprising the Group V semiconductor element and substitutional defects comprising the Group V semiconductor element, wherein the interstitial defects and the substitutional detects combined have a concentration in the range of approximately $1 \times 10^{18}$ cm$^{-3}$ to approximately $1 \times 10^{20}$ cm$^{-3}$; and
    a channel layer disposed over the buffer layer.

11. A pHEMT as claimed in claim 10, wherein the buffer layer electrically shields carriers in the channel from deep level traps in the substrate.

12. A pHEMT device as claimed in claim 10, wherein the buffer layer further comprises comparatively fast traps arising from excess Group V atoms in the buffer layer.

13. A pHEMT as claimed in claim 12, wherein the comparatively fast traps have a lifetime in the range of approximately 1 femtosecond (fs) to approximately 1 picosecond (ps).

14. A pHEMT as claimed in claim 10, wherein the channel layer is a pseudomorphic channel layer.

15. A pHEMT as claimed in claim 8, wherein the charge supply layer is a first charge supply layer, and the pHEMT comprises a second charge supply layer disposed over the pseudomorphic channel layer.

16. A pHEMT as claimed in claim 15, wherein the buffer layer electrically shields carriers in the channel from deep level traps in the substrate.

17. A pHEMT device as claimed in claim 15, wherein the butler layer further comprises comparatively fast traps arising from excess Group V atoms in the buffer layer.

18. A pHEMT as claimed in claim 17, wherein the comparatively fast traps have a lifetime in the range of approximately 1 femtosecond (fs) to approximately 1 picosecond (ps).

19. A pseudomorphic high electron mobility transistor (pHEMT), comprising:
    a substrate comprising a Group III-V semiconductor material; and
    a buffer layer disposed over the substrate, wherein the buffer layer comprises microprecipitates of a Group V semiconductor element;
    a channel layer disposed over the buffer layer; and
    a plurality of layers disposed over the substrate and between the buffer layer and the channel layer, wherein a total thickness of the plurality of layers is in the range of approximately 500 Å to approximately 3500 Å.

20. A pHEMT as claimed in claim 19, wherein the buffer layer electrically shields carriers in the channel from deep level traps in the substrate.

21. A pHEMT device as claimed in claim 19, wherein the buffer layer further comprises comparatively fast traps arising from excess Group V atoms in the buffer layer.

22. A pHEMT as claimed in claim 21, wherein the comparatively fast traps have a lifetime in the range of approximately 1 femtosecond (fs) to approximately 1 picosecond (ps).

23. A pHEMT as claimed in claim 19, wherein the channel layer is a pseudomorphic channel layer.

* * * * *